(12) United States Patent
Jessep et al.

(10) Patent No.: US 7,271,349 B2
(45) Date of Patent: Sep. 18, 2007

(54) VIA SHIELDING FOR POWER/GROUND LAYERS ON PRINTED CIRCUIT BOARD

(75) Inventors: Rebecca A. Jessep, Dallas, OR (US); Terrance J. Dishongh, Hillsboro, OR (US); Carolyn R. McCormick, Hillsboro, OR (US); Thomas O. Morgan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/888,064

(22) Filed: Jul. 8, 2004

(65) Prior Publication Data
US 2004/0238216 A1 Dec. 2, 2004

Related U.S. Application Data

(62) Division of application No. 10/234,772, filed on Sep. 4, 2002, now Pat. No. 7,168,164.

(51) Int. Cl.
*H01R 12/14* (2006.01)
*H05K 1/11* (2006.01)

(52) U.S. Cl. ............... 174/262; 174/265; 174/266
(58) Field of Classification Search ........ 174/260–266; 361/792–795; 428/209–210; 29/852–854
See application file for complete search history.

(56) References Cited

U.S. PATENT DOCUMENTS

| 3,739,469 | A | * | 6/1973 | Dougherty, Jr. ............... 29/852 |
|---|---|---|---|---|
| 3,932,932 | A | | 1/1976 | Goodman |
| 4,170,819 | A | | 10/1979 | Peter et al. |
| 4,183,137 | A | | 1/1980 | Lomerson |
| 5,257,452 | A | | 11/1993 | Imai et al. |
| 5,317,476 | A | * | 5/1994 | Wallace et al. ............. 361/220 |
| 5,374,788 | A | * | 12/1994 | Endoh et al. ............... 174/266 |
| 5,421,083 | A | * | 6/1995 | Suppelsa et al. ............. 29/852 |
| 5,587,119 | A | | 12/1996 | White |
| 5,779,836 | A | * | 7/1998 | Kerrick ...................... 156/150 |
| 5,863,447 | A | | 1/1999 | Coteus et al. |
| 5,949,030 | A | | 9/1999 | Fasano et al. |
| 5,959,348 | A | * | 9/1999 | Chang et al. ............... 257/700 |
| 5,981,880 | A | | 11/1999 | Appelt et al. |
| 6,201,194 | B1 | * | 3/2001 | Lauffer et al. ............. 174/264 |

* cited by examiner

*Primary Examiner*—Tuan T. Dinh
(74) *Attorney, Agent, or Firm*—Blakely, Sokoloff, Taylor & Zafman LLP

(57) ABSTRACT

A protective coating of insulating material is formed around a clearance hole in a conductive layer of a printed circuit board, so that the conductive material in a via within the clearance hole will not contact the conductive layer and create a short circuit. In one embodiment, the protective coating is sufficiently hard to deflect a drill bit being used to drill the via hole, thus protecting against misregistered drilled holes.

14 Claims, 7 Drawing Sheets

VIA SHIELDING FOR POWER/GROUND LAYERS ON PRINTED CIRCUIT BOARD

This is a Divisional Application of Ser. No. 10/234,772 filed Sep. 4, 2002, now U.S. Pat. No 7,168,164 which is presently pending.

BACKGROUND

1. Technical Field

Various embodiments of the invention relate generally to printed circuit board technology, and in particular relate to printed circuit boards with conductive inner layers.

2. Description of the Related Art

A typical printed circuit board (PCB) may have multiple signal routing layers containing traces to transmit signals to and from components mounted on the PCB. The PCB may also have a number of plated-through holes, or vias, used to connect specific traces on different signal routing layers. The vias may extend through one or more conductive layers (e.g., power and/or ground planes) between the signal routing layers. To prevent an inadvertent short circuit between a via and a conductive layer, a clearance hole (also called an anti-pad) within which the conductive material is removed is typically formed in the conductive layer around each via.

For example, a clearance hole having a larger diameter than the via may be formed in the conductive layers prior to drilling the via hole. Subsequently, the via hole may be drilled through the clearance hole and plated with a conductive plating material. If everything is done with sufficient precision, the smaller-diameter via will be centered within the larger-diameter clearance hole, and the difference in their respective diameters will prevent inadvertent electrical contact between the plated-through via and the conductive layer. However, laminate shift and/or drill mis-registration may cause the drill pattern to shift until part of the drilled via hole contacts the conductive material, which may result in an electrical short circuit between the conductive area outside the clearance hole and the conductive plating material in the via.

To reduce the probability of electrical shorts between vias and conductive layers due to drilling errors, PCB manufacturers typically require a minimum distance between a drilled via hole and the inner edge of a clearance hole, thus increasing the minimum allowed size of the clearance hole. Also, design rules may require that conductive traces carrying controlled impedance signals are not routed over a clearance hole on an adjacent conductive plane used as a reference in order to avoid fluctuations in the impedance caused by a discontinuity in the critical dielectric spacing. For these reasons, increasing the size of the clearance hole to accommodate possible drill mis-registration in the via hole may reduce the amount of usable area on signal routing layers above and/or below the conductive layers.

BRIEF DESCRIPTION OF THE DRAWINGS

The invention may be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Various embodiments of the invention include a coating of non-conductive dielectric material (e.g., an insulating polymer material) applied to an inner edge of a clearance hole formed through one or more conductive inner layers of a PCB. The dielectric material may shield the inner edges of the conductive layers around the clearance hole from the conductive plating material of a via, thus preventing electrical short circuits due to laminate shift and/or drill mis-registration. Coating the inner edge of the clearance hole with the dielectric material may allow a minimum allowable diameter of the clearance hole to be reduced, thus leaving more area available for other uses, such as routing controlled impedance signals through adjacent signal routing layers without passing over clearance holes.

Figure 1A:
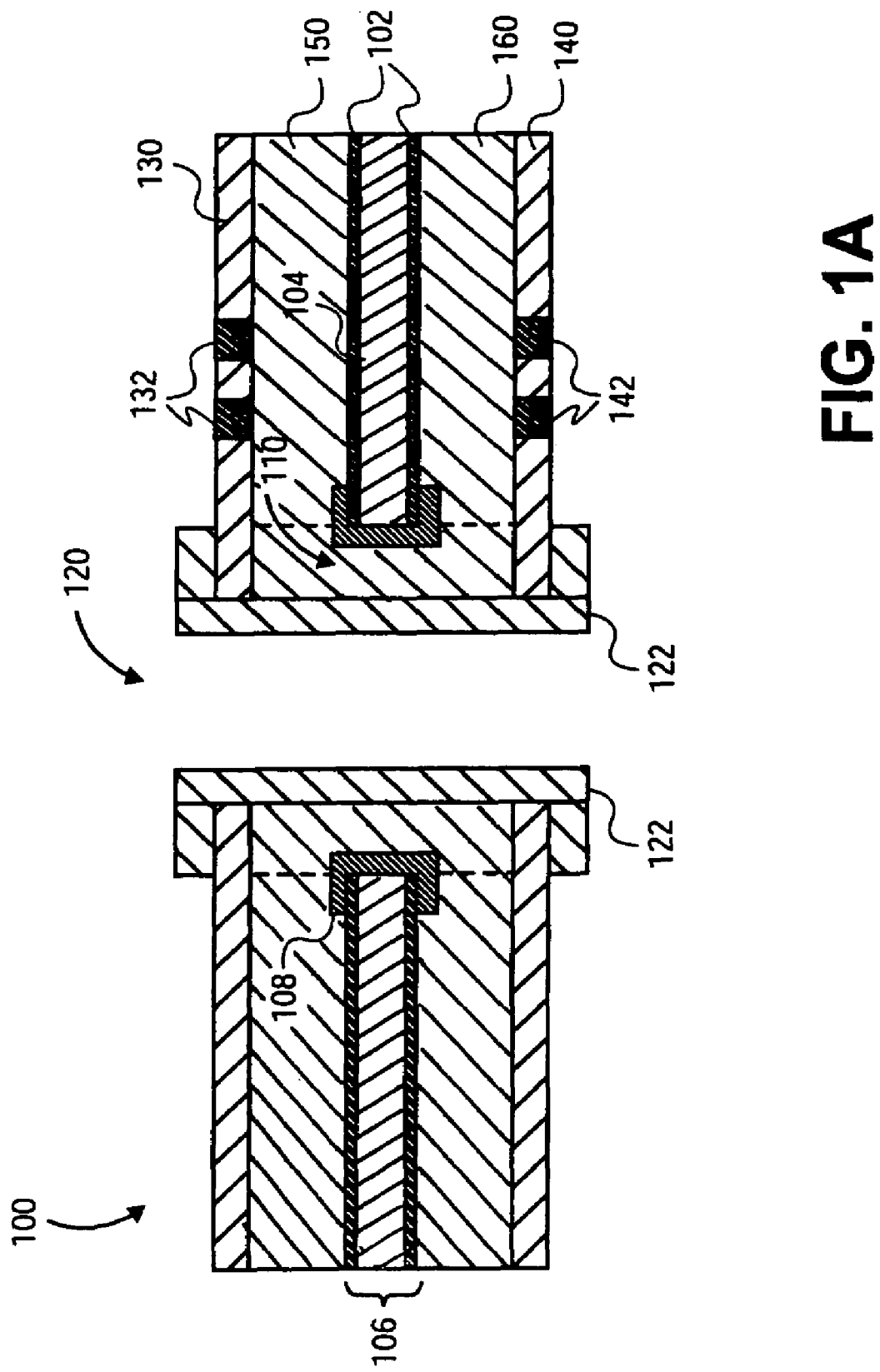
FIGS. 1A, 1B show a cross section of a portion of a PCB, according to one embodiment of the invention.
Figure 1B:
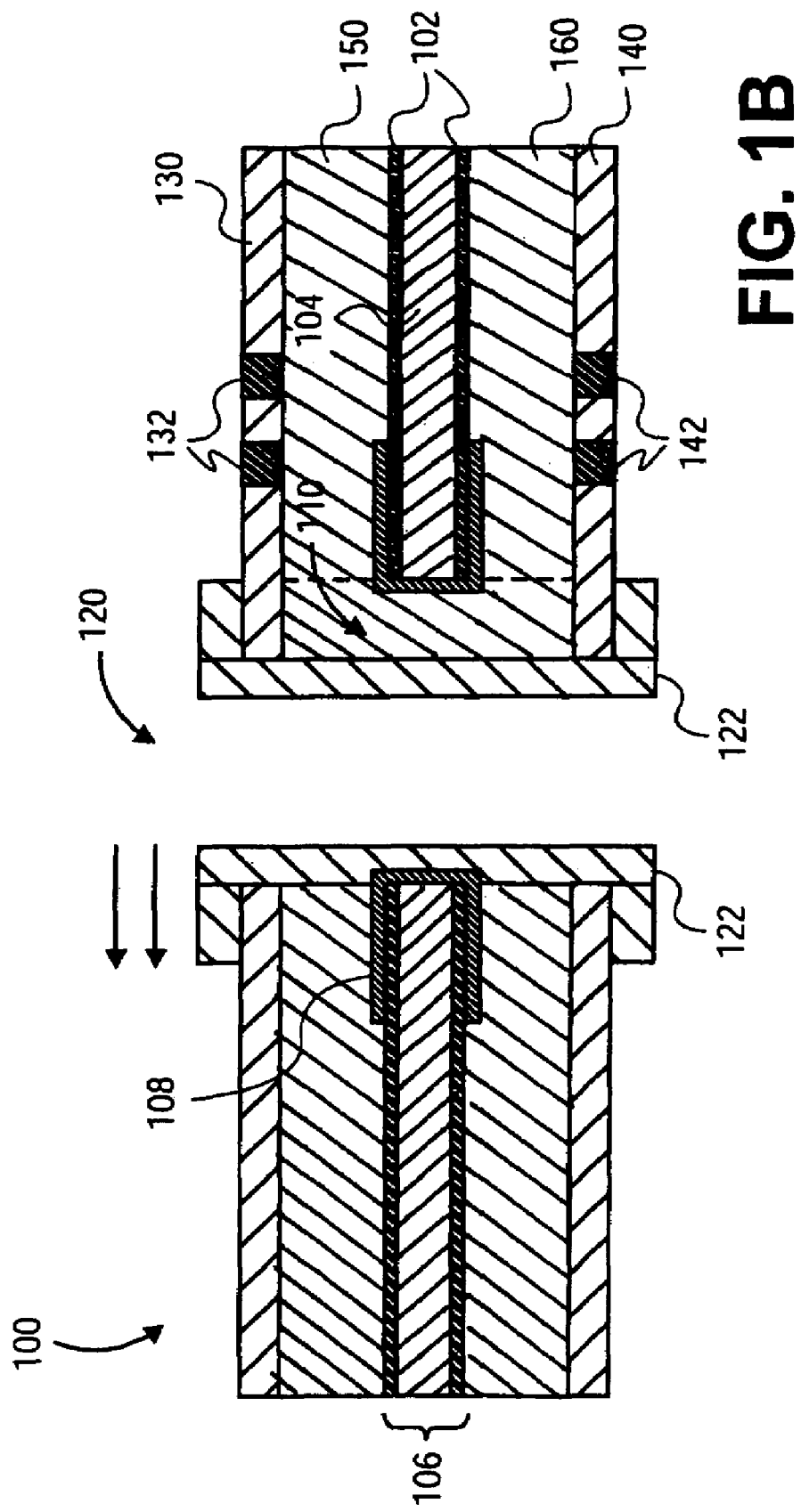

FIGS. 1A, 1B show a cross section of a portion of a PCB, according to one embodiment of the invention. In the embodiment shown in FIG. 1A, the PCB 100 has conductive inner layers 102 formed on opposing surfaces of a substrate comprising a first dielectric material 104, which together form an inner laminate 106. While in one embodiment, conductive layers 102 are primarily ground and/or power planes, in another embodiment conductive layers 102 include significant signal routing paths. Top signal routing layer 130 and bottom signal routing layer 140 may be separated from conductive inner layers 102 by dielectric layers 150 and 160, respectively. While in one embodiment signal routing layers 130, 140 are comprised primarily of signal traces, in another embodiment signal routing layers 130, 140 include significant ground and/or power surfaces. The conductive and signal routing layers may be any suitable conductive material, such as copper, aluminum, an alloy of conductive metals, etc. For example, the conductive and signal routing layers may be copper clad to the first dielectric material 104, which may be a material such as FR-4 or bismaleimide-triazine (BT) material. While the illustrated embodiment of FIG. 1A shows two inner conductive layers and two signal routing layers, other embodiments may have any feasible number of conductive and signal routing layers, separated appropriately by dielectric layers. In one embodiment dielectric layers 104, 150, and 160 are made of the same material, but in other embodiments they may be made of two or more different materials.

In the embodiment of FIG. 1A, a via 120 may extend through the conductive inner layers 102 to electrically connect the top signal routing layer 130 to the bottom signal routing layer 140. The via 120 may be formed by any suitable method, such as drilling a via hole in the PCB 100 and plating the via hole with a plating material 122. Prior to forming the via hole, a clearance hole 110 may be formed through inner laminate 106 by removing those portions of conductive layers 102 and first dielictic material 104 that are in the immediate vicinity of the intended location of the via hole. In one embodiment, the clearance hole is circular, concentric with respect to the intended center of the via hole 120. While in one embodiment a round clearance hole 110 is formed by drilling the clearance hole through inner laminate 106 (thereby removing both first dielectric material 104 and conductive layers 102 with the same diameter clearance hole), other embodiments may use other techniques to create the clearance hole (e.g., punching, etc.) and the hole may have a non-circular shape. In one embodiment, the remaining layers of conductive and dielectric material may be assembled after forming the clearance hole in inner laminate 106. PCB 100 may then have via hole 120 formed as previously described.

Although the description herein refers to the assembly 100 as a four-layer PCB, in some embodiments additional layers (not shown) may be added above and/or below conductive layers 130 and 140 to form a higher layer count PCB. One or more of these additional layers may include elements described for PCB 100.

As shown in FIG. 1B, laminate shift and/or drill misregistration may cause the via 120 to be shifted relative to the clearance hole 110 so that the via hole and the clearance hole are no longer concentric with each other. If the error is great enough, conductive layers 102 may be exposed and plated with conductive material, which in a conventional PCB might create an inadvertent short circuit. However, various embodiments of the invention include a coating of second dielectric material 108 to shield the inner edges of the clearance hole 110 from electrical contact with the plating material 122.

In various embodiments, the second dielectric material 108 may be any suitable dielectric material and in one embodiment may have a higher dielectric constant than the first dielectric material 104. In a particular embodiment, while the first dielectric material 104 is an FR-4 material with a dielectric constant in the range of 4-5, the second dielectric material is a ceramic material with a dielectric constant of approximately 10, which may permit a thin coating of the second dielectric material. In an alternate embodiment, the second dielectric material 108 has a lower dielectric constant than the first dielectric material 104. In a particular alternate embodiment, the second dielectric material 108 is a polytetrafluoroethylene material with a dielectric constant of approximately 3. If the polytetrafluoroethylene material does not have a strong enough adhesion to the conductive inner layers 102, subsequent layers of dielectric material 150 and 160 may hold the polytetrafluoroethylene material in place.

In some embodiments, the second dielectric material 108 is an insulating polymer material that may also provide superior adhesion to a surface of the conductive inner layers 102. In one embodiment, the second dielectric material 108 is a material (e.g., carbon-loaded epoxy) with a hardness sufficient to deflect a drill bit without chipping. Therefore, the coating of second dielectric material 108 may remain intact to shield the inner surface of the clearance hole from the conductive plating material 122 even if the drill is misregistered enough to contact the second dielectric material 108.

Figure 2:
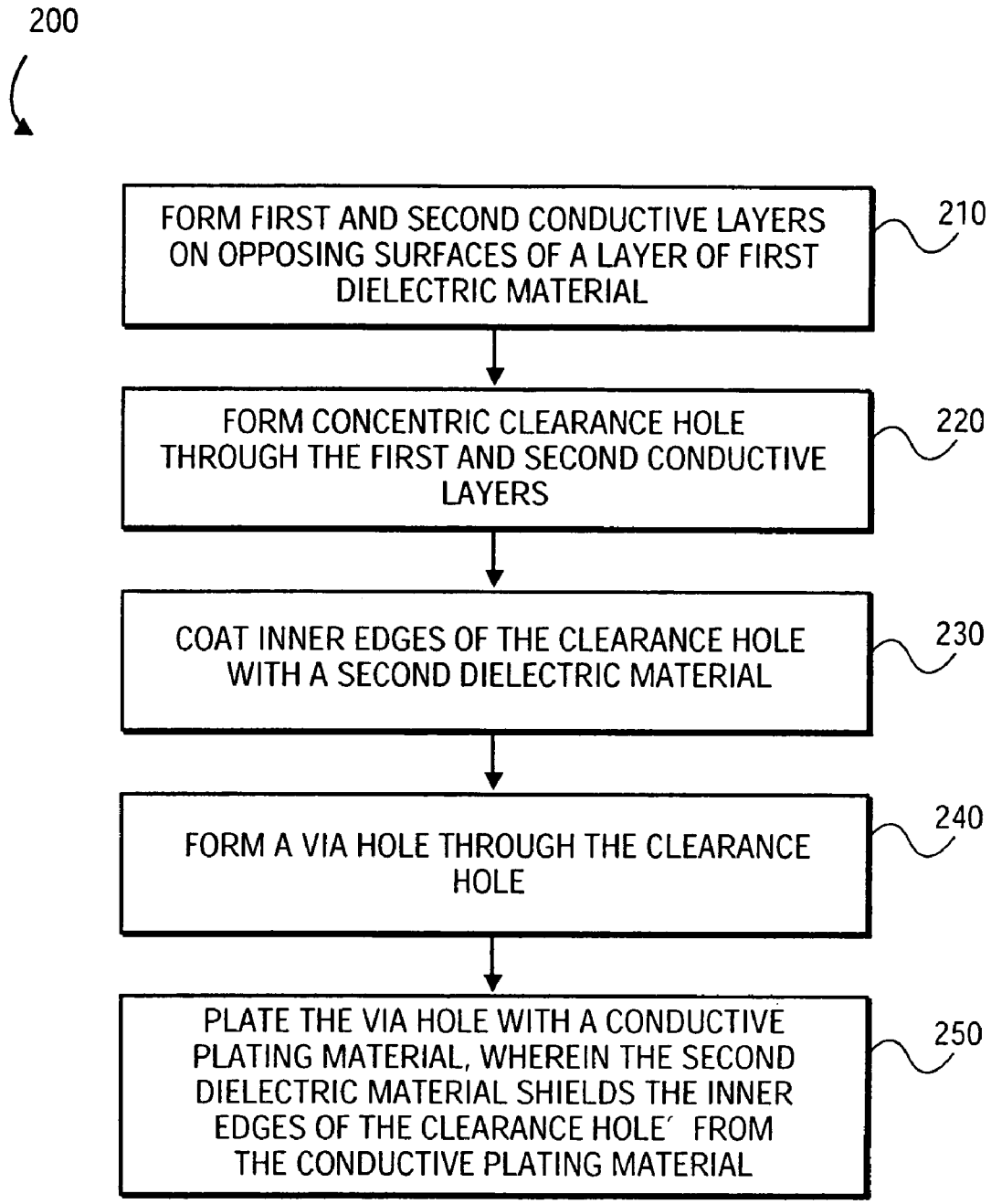
FIG. 2 shows a flow diagram of a method, according to one embodiment of the invention.

FIG. 2 shows a flow diagram of a method, according to one embodiment of the invention. FIGS. 3A-3D show a cross section of a portion of an inner laminate of a PCB at different fabrication stages, according to one embodiment of the invention. Although FIGS. 3A-3D show a laminate 106 with two conductive layers, the same principles may be applied to PCB assemblies with other numbers of conductive layers.

Although the following text may refer both to the method of flow diagram 200 in FIG. 2 and to a structure illustrated in FIGS. 3A-3D, it is understood that the method of FIG. 2 and the structure of FIGS. 3A-3D may be implemented independently of each other.

Figure 3A:
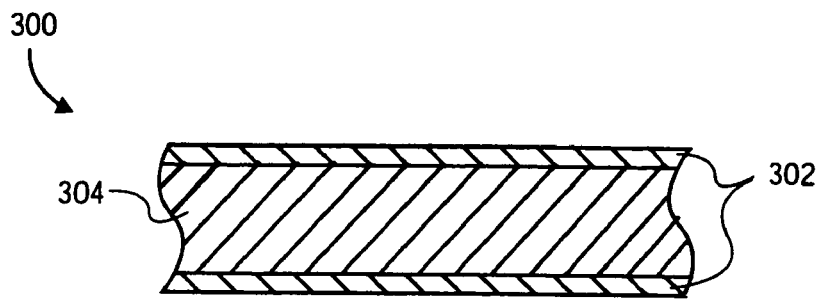
FIGS. 3A-3D show a cross section of an inner laminate of a PCB at different processing stages, according to one embodiment of the invention.

In flow chart 200, at block 210 first and second conductive layers are formed on opposing surfaces of a layer of first dielectric material. FIG. 3A illustrates an example PCB inner laminate 300 comprising conductive layers 302 formed on a layer of first dielectric material 304. For some embodiments the layer of first dielectric material 304 is a substrate, and the conductive layers 302 are copper clad to the substrate, but other embodiments may use other materials.

Figure 3B:
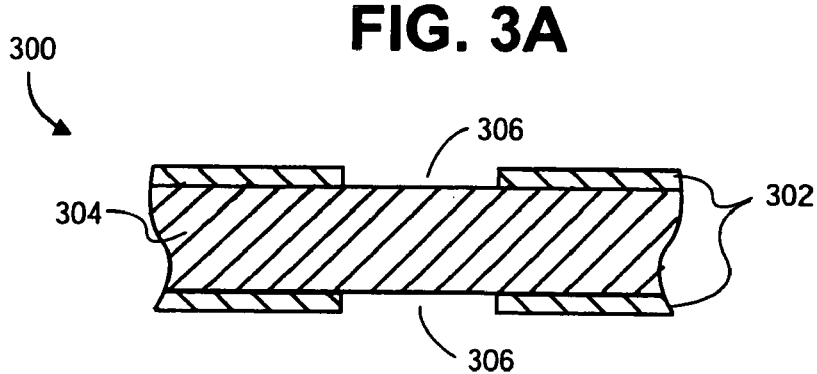
Figure 3C:
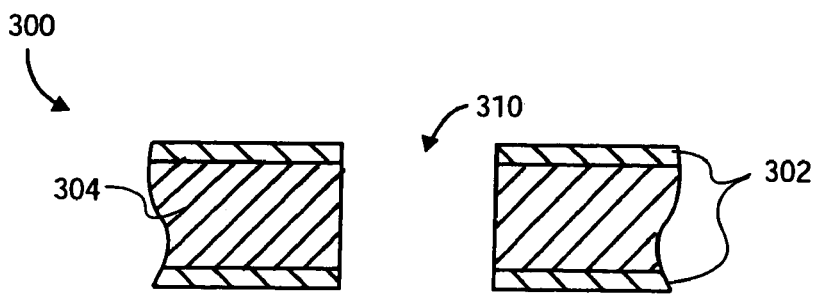

At block 220, a clearance hole is formed through the first and second conductive layers. While in one embodiment the clearance hole is round and concentric with respect to the intended center of the associated via hole, in another embodiment the clearance hole may not be concentric and may have another shape. The clearance hole may be formed by any suitable method. For example, as illustrated in FIG. 3B, portions of the conductive layers 302 may be removed by any known or yet-to-be-developed etching process to form non-conductive areas 306 in conductive layers 302. The first dielectric material 304 between the conductive layers 302 may also be removed to form clearance hole 310, as illustrated in FIG. 3C. Removal may be by any suitable process (e.g., plasma etching, laser drilling, mechanical drilling, etc.) While in one embodiment removal of conductive material and removal of the first dielectric material may take place in separate operations, in another embodiment the clearance hole 310 may be formed through both conductive and dielectric materials in a single operation (e.g., mechanical drilling, laser drilling, punching through the PCB inner laminate 300, etc.).

Figure 3D:
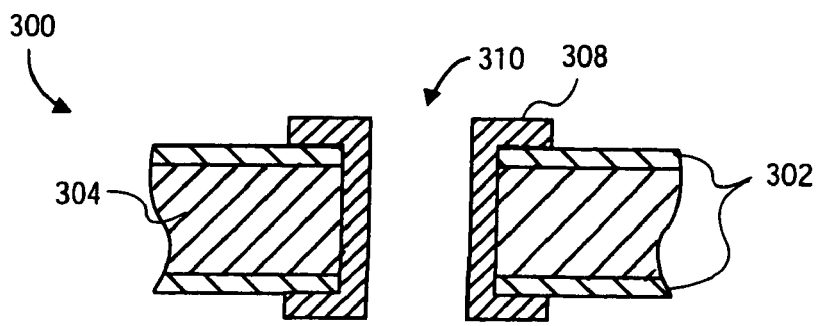

At block 230, the inner edge of the clearance hole is coated with a second dielectric material. For example, a second dielectric material 308 may be applied as shown in FIG. 3D, thereby covering inner edges of the conductive layers 302 where clearance hole 310 is formed. In one embodiment the second dielectric material 308 may be applied to form an annular ring around the edge of clearance hole 310 that extends between the conductive layers 302. The annular ring may assist in securing the second dielectric to the conductive layers 302, and may also serve to deflect a misregistered drill bit.

Figure 4:
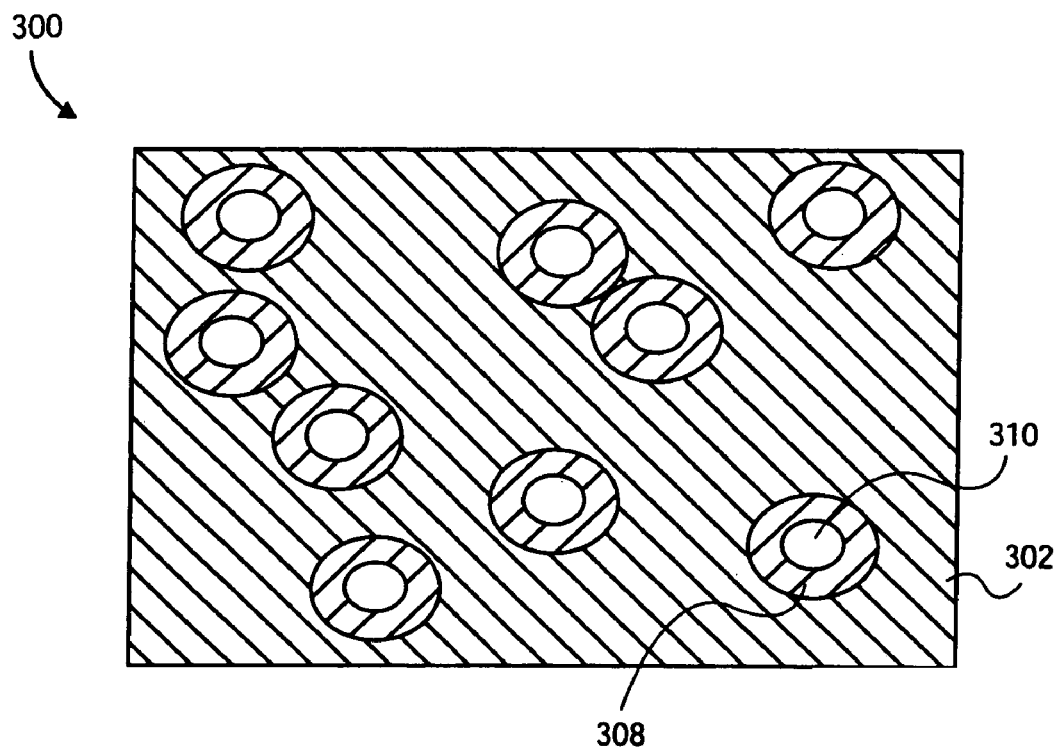
FIG. 4 shows a top view of the inner laminate of FIG. 3D, according to one embodiment of the invention.

FIG. 4 shows an expanded top view of the inner laminate of FIG. 3D, according to one embodiment of the invention. The embodiment illustrated in FIG. 4 shows multiple clearance holes 310 in the PCB inner laminate 300. The second dielectric material 308 may be applied to coat the clearance holes 310 by any suitable process, such as stencil printing. For example, openings in a stencil may be aligned with the clearance holes 310, and the second dielectric material may be applied to the clearance holes 310 through the openings. The second dielectric material may be applied through both sides of PCB inner laminate 300 to ensure the inner edges of both conductive layers 302 are coated.

Figure 5:
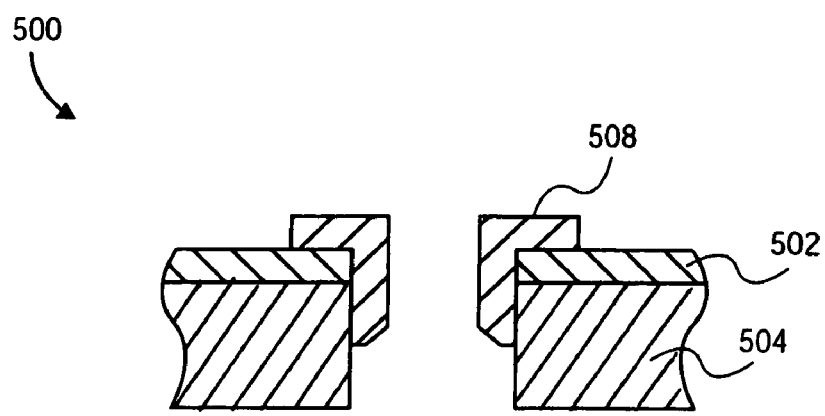
FIG. 5 shows a cross section of an inner laminate of a PCB, according to another embodiment of the invention.

The previously described embodiments illustrate multiple conductive layers, with the second dielectric 308 extending between the multiple layers. FIG. 5 shows a cross section of a portion of an inner laminate of a PCB according to another embodiment of the invention. As illustrated in FIG. 5, for some embodiments a PCB inner laminate 500 may comprise a single conductive layer 502 formed on a layer of first dielectric material 504. A coating of second dielectric material 508 may be applied to an inner edge of a clearance hole, but without extending the second dielectric material throughout the length of the clearance hole. In an alternate embodiment, the limited application of dielectric as shown in FIG. 5 may be applied to each surface of a PCB inner laminate having two conductive layers, so the dielectric protects both layers but does not extend throughout the length of the clearance hole.

Returning to FIG. 2, at block 240 a via hole is formed through the clearance hole. At block 250 the via hole is plated with a conductive plating material, with the second dielectric material shielding the inner edge of the clearance hole from the conductive plating material. For example, referring back to FIG. 1A, the via 120 may electrically connect signal routing layers 130 and 140, which may be formed on the additional layers of the dielectric material 150 and 160, respectively. The additional layers of dielectric material 150 and 160 and the signal routing layers 130 and 140 may be formed by any suitable processes. For some embodiments of the invention, a blind via may be formed through a clearance hole. For example, the blind via may connect an outer surface signal routing layer with an inner surface signal routing layer.

Figure 6:
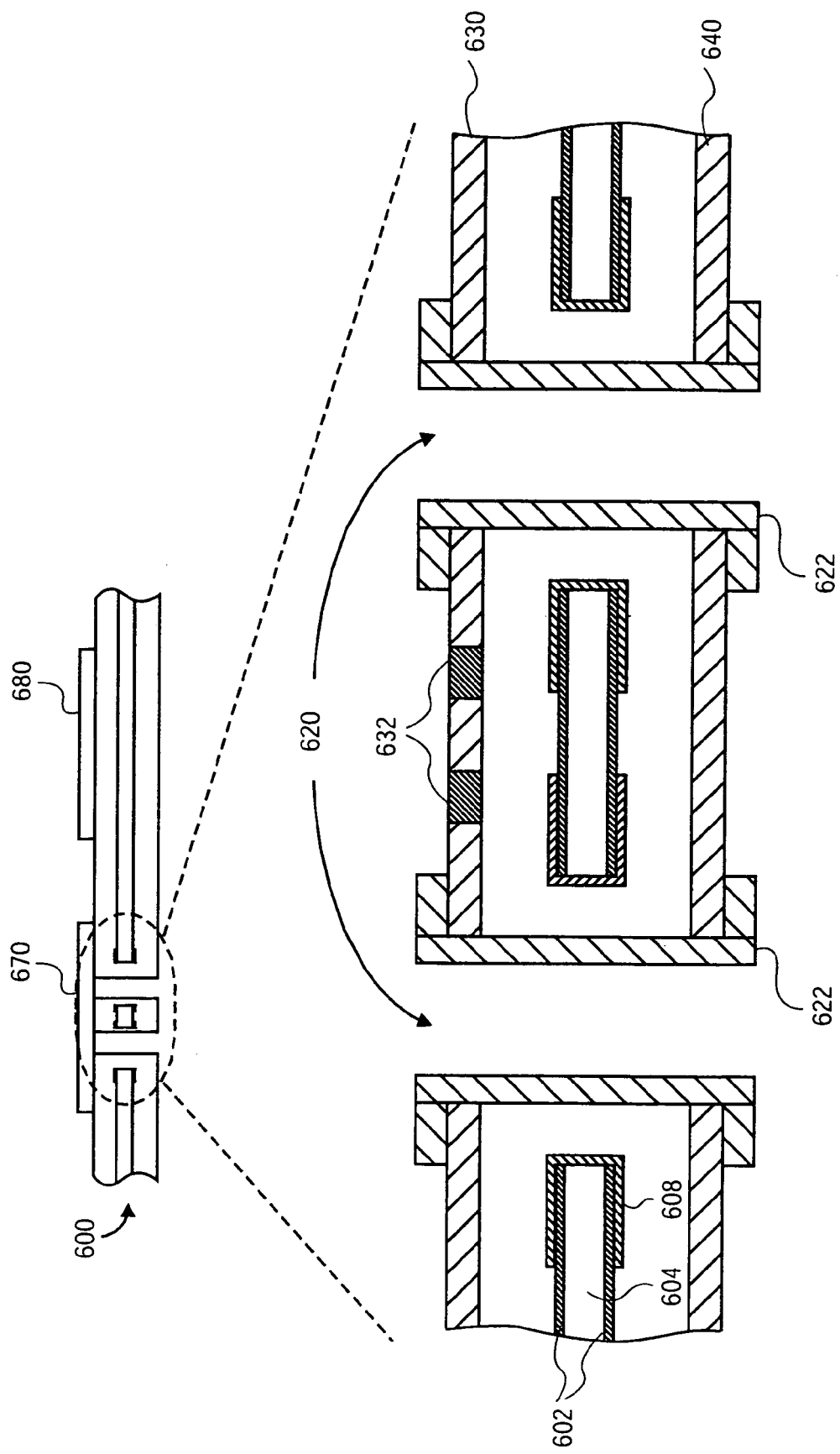
FIG. 6 shows a cross section of a PCB of a system, according to one embodiment of the invention.
Figure 7:
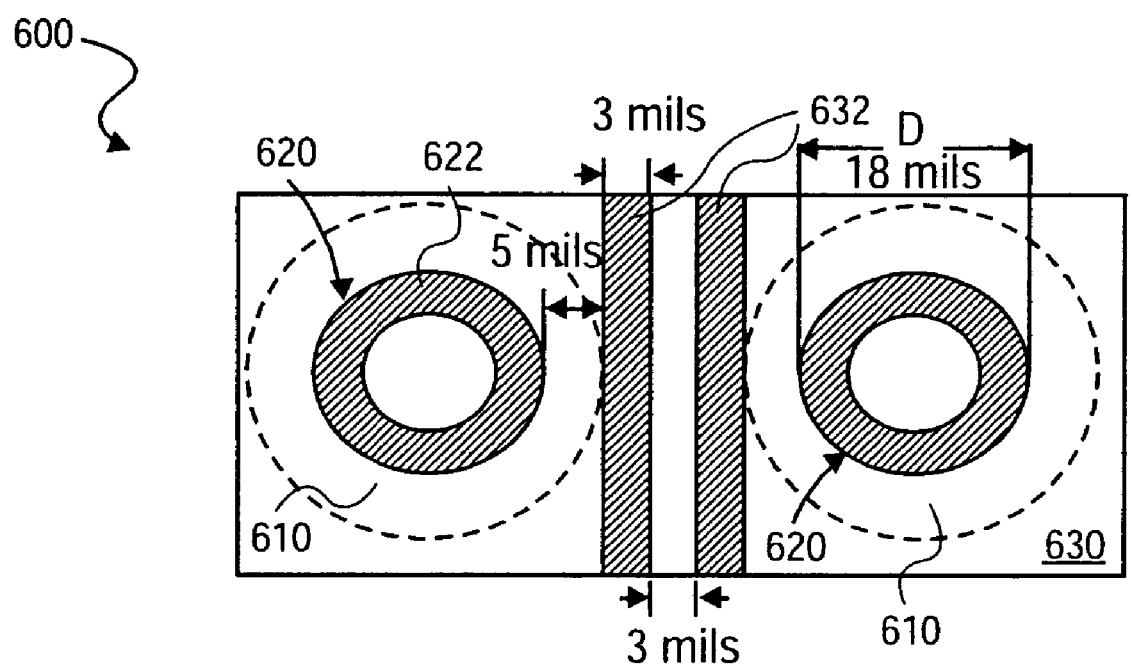
FIG. 7 shows a top view of the PCB of FIG. 6, according to one embodiment of the invention.

FIG. 6 shows a cross section of a PCB of a system, according to one embodiment of the invention. FIG. 7 shows a top view of the PCB of FIG. 6, according to one embodiment of the invention. With reference to FIG. 6, the illustrated embodiment includes components 670 and 680 mounted on a PCB 600. The PCB 600 may comprise adjacent vias 620 (e.g., formed with a material 622) that electrically connect a top surface signal routing layer 630 to a bottom surface signal routing layer 640. As illustrated, the top surface signal routing layer may include multiple conductive traces 632 to carry signals to and from the component 670.

In one embodiment of the invention, the components 670, 680 may include a processor and the PCB 600 may be a motherboard of a desktop computer. In another embodiment, the components 670, 680 may include multiple processors and the PCB 600 may be a server board. Components 670, 680 may also include sockets. In some embodiments, conductive traces 632 may carry a pair of controlled impedance signals to one or more processors.

For proper operation, conductive traces that carry controlled impedance signals may need to maintain a fixed distance from a reference plane throughout the length of the traces, and the traces may therefore need to avoid traveling over any clearance holes. For example, differential clock signals carried on the conductive traces 632 may reference the conductive layer 602 immediately below the signal routing layer 630 as a return path. If portions of the conductive traces 632 pass over a clearance hole 610 on the conductive layer 602, a discontinuity in the impedance of the return path may cause fluctuations in the differential signals. This may be particularly important in server applications, where conductive traces 632 carrying differential clock signals may be routed to multiple processors. A coating of second dielectric material 608 shielding inner edges of clearance holes 610 may allow the clearance holes 610 to have a smaller diameter than typically allowed by PCB manufacturers, thus permitting increased signal routing density.

The dimensions indicated in FIG. 7 show an embodiment of the invention with a clearance hole having a diameter no more than 10 mils (0.010 inches) greater than a diameter of the via, but other embodiments may have other dimensions. FIG. 7 further shows conductive traces 632 routed up to the edges of clearance holes 610 (as seen from above and as shown by the dashed line) on the conductive layer 602 below. The indicated dimensions permit two 3-mil wide signal traces separated from each other by 3 mils to fit between two 18-mil diameter vias that are spaced no more than 37 mils apart (center-to-center), without encroaching on the space above the clearance holes.

In the foregoing description, the invention has been described with reference to specific exemplary embodiments thereof. It will, however, be evident that various modifications and changes may be made thereto without departing from the broader spirit or scope of the appended claims. The specification and drawings are, accordingly, to be regarded in an illustrative rather than a restrictive sense.

What is claimed is:

1. An apparatus, comprising:
a printed circuit board comprising
first and second conductive layers disposed on opposing surfaces of a substrate of a first dielectric material;
a first clearance hole formed through the first and second conductive layers and the substrate;
a second clearance hole formed through the first and second conductive layers and the substrate;
a coating of a second dielectric material disposed on an inner edge of the first and second conductive layers and the substrate that form the first and second clearance holes, wherein the second dielectric covers a side of the first conductive layer, a side of the second conductive layer, and a side of the substrate within the first and second clearance holes;
a first signal routing layer separated from the first conductive layer by a first dielectric layer of a third dielectric material;
a second signal routing layer separated from the second conductive layer by a second dielectric layer;
a first plated-through via disposed between the first and second signal routing layers through the first clearance hole, the plated-through via electrically insulated from the first and second conductive layers and the substrate by the second dielectric material;
a second plated-through via disposed between the first and second signal routing layers through the second clearance hole, the plated-through via electrically insulated from the first and second conductive layers and the substrate by the second dielectric material; and
a first and second signal traces in the first signal routing layer disposed between the first and second plated-through vias.

2. The apparatus of claim 1, wherein:
the second dielectric material comprises an insulating polymer material.

3. The apparatus of claim 1, wherein:
the first and second conductive layers comprise copper.

4. The apparatus of claim 1, wherein:
the first dielectric material comprises an FR-4 material.

5. The apparatus of claim 1, wherein:
the coating of the second dielectric material comprises an annular ring of the second dielectric material.

6. The apparatus of claim 1, wherein:
the coating of the second dielectric material has a portion laminated between the first dielectric layer of the third dielectric material and the first conductive layer.

7. The apparatus of claim 1, wherein:
the coating of the second dielectric material extends over the first conductive layer but only near the first and second clearance holes.

8. The apparatus of claim 2, wherein:
the insulating polymer material comprises a carbon loaded epoxy material.

9. The apparatus of claim 6, wherein:
the second dielectric material has an adhesion to the first conductive layer weaker than the third dielectric material.

10. An apparatus, comprising:
a printed circuit board comprising
    first and second conductive layers disposed on opposing surfaces of a substrate of a first dielectric material;
    first and second clearance holes formed through the first and second conductive layers and the substrate;
    a coating of a second dielectric material disposed on an inner edge of the first and second conductive layers and the substrate that form the first and second clearance holes, wherein the second dielectric coats a side of the first conductive layer, a side of the second conductive layer, and a side of the substrate within the first and second clearance holes;
    a first signal routing layer separated from the first conductive layer by a first dielectric layer;
    a second signal routing layer separated from the second conductive layer by a second dielectric layer;
    a first plated-through via disposed between the first and second signal routing layers through the first clearance hole, the plated-through via electrically insulated from the first and second conductive layers and the substrate by the second dielectric material wherein a diameter of the first clearance hole is no more than approximately 10 mils greater than a diameter of the first plated-through via;
    a second plated-through via disposed between the first and second signal routing layers through the second clearance hole, the plated-through via electrically insulated from the first and second conductive layers and the substrate by the second dielectric material wherein a diameter of the second clearance hole is no more than approximately 10 mils greater than a diameter of the second plated-through via; and
    first and second signal traces in the first signal routing layer disposed between the first and second plated-through vias.

11. An apparatus comprising:
a printed circuit board comprising
    a conductive layer disposed between first and second signal routing layers and separated from the first and second signal routing layers by a dielectric material;
    first and second clearance holes through the conductive layer;
    a first plated-through via extending between the first and second signal routing layers through the first clearance hole;
    a second plated-through via extending between the first and second signal routing layers through the second clearance hole;
    a coating of an insulating material on inner edges of the first and second clearance holes to electrically insulate the conductive layer from the first and second vias; and
    first and second signal traces in the first signal routing layer disposed between the first and second vias.

12. The apparatus of claim 11, wherein:
the first and second signal traces are to carry differential signals.

13. The apparatus of claim 12, wherein:
an edge of the first signal trace is disposed within approximately 5 mils of an edge of the first via.

14. The apparatus of claim 13, wherein:
an edge of the second signal trace is disposed within approximately 5 mils of an edge of the second via.

* * * * *

UNITED STATES PATENT AND TRADEMARK OFFICE
CERTIFICATE OF CORRECTION

| | | |
|---|---|---|
| PATENT NO. | : 7,271,349 B2 | |
| APPLICATION NO. | : 10/888064 | |
| DATED | : September 18, 2007 | |
| INVENTOR(S) | : Jessep et al. | |

It is certified that error appears in the above-identified patent and that said Letters Patent is hereby corrected as shown below:

The sheet of drawing consisting of Figure 2 should be deleted to appear as per attached figure 2.

Signed and Sealed this

Tenth Day of June, 2008

JON W. DUDAS
*Director of the United States Patent and Trademark Office*

200

FORM FIRST AND SECOND CONDUCTIVE LAYERS ON OPPOSING SURFACES OF A LAYER OF FIRST DIELECTRIC MATERIAL — 210

FORM CONCENTRIC CLEARANCE HOLES THROUGH THE FIRST AND SECOND CONDUCTIVE LAYERS — 220

COAT INNER EDGES OF THE CLEARANCE HOLES WITH A SECOND DIELECTRIC MATERIAL — 230

FORM A VIA HOLE THROUGH THE CLEARANCE HOLES — 240

PLATE THE VIA HOLE WITH A CONDUCTIVE PLATING MATERIAL, WHEREIN THE SECOND DIELECTRIC MATERIAL SHIELDS THE INNER EDGES OF THE CLEARANCE HOLES FROM THE CONDUCTIVE PLATING MATERIAL — 250

FIG. 2